United States Patent [19]
Katzenstein

[11] Patent Number: 5,059,980
[45] Date of Patent: * Oct. 22, 1991

[54] NON-LINEAR ANALOG TO DIGITAL CONVERTER

[75] Inventor: Henry S. Katzenstein, Pacific Palisades, Calif.

[73] Assignee: Brooktree Corporation, San Diego, Calif.

[*] Notice: The portion of the term of this patent subsequent to May 22, 2007 has been disclaimed.

[21] Appl. No.: 597,511

[22] Filed: Oct. 12, 1990

Related U.S. Application Data

[63] Continuation-in-part of Ser. No. 321,992, Mar. 10, 1989, abandoned, which is a continuation-in-part of Ser. No. 231,100, Aug. 11, 1988, Pat. No. 4,928,102.

[51] Int. Cl.⁵ ............... H03M 1/36; H03M 1/58; H03M 1/78
[52] U.S. Cl. ................... 341/159; 341/138; 341/154; 338/308
[58] Field of Search ............ 338/72, 89, 90, 91, 338/92, 307, 309, 312, 313, 330; 341/138, 154, 155, 158, 159

[56] References Cited

U.S. PATENT DOCUMENTS

| | | | |
|---|---|---|---|
| 3,336,558 | 8/1967 | Wright | 338/90 |
| 3,460,026 | 8/1969 | Dow et al. | 338/309 |
| 3,564,475 | 2/1971 | Fujii et al. | 338/89 |
| 4,232,302 | 11/1980 | Jagatich | 341/138 |
| 4,625,197 | 11/1986 | Holmes | 341/138 |

Primary Examiner—Howard L. Williams
Attorney, Agent, or Firm—Ellsworth R. Roston; Charles H. Schwartz

[57] ABSTRACT

First terminals are equally spaced on a substantially uniformly resistive thin film at or near a first side edge of the film at progressive positions downwardly from the top of the film. Near the bottom of the film, second terminals are preferably equally spaced progressively inwardly from the first side edge of the film. An energizing potential is applied to the film either at the corner defined by the top and the first side edge of the film or in a curved pattern of positions near such corner. A reference potential (e.g. ground) is applied to the film near the otherside of the film and near the bottom edge of the film. Voltages are thus produced at the successive ones of the first terminals with an exponential relationship with respect to such terminal positions and at the successive ones of the second terminals with a linear relationship with respect to such terminal positions. The disposition of the second terminals may be compensated for deviations in a logarithmic response in an output member (e.g. an electron gun in a cathode ray tube) receiving the voltages on such terminals. Cuts may be provided from the other side edge of the resistive surface in a horizontal direction partially toward the first side edge of the resistive surface to decrease the width of the resistive surface. Each of a plurality of comparators receives an input voltage first and second and the voltage at an individual one of the terminals. The comparators provide an output indicative of magnitude of the input voltage.

62 Claims, 8 Drawing Sheets

NON-LINEAR ANALOG TO DIGITAL CONVERTER

This is a continuation-in-part of application Ser. No. 321,992, now abandoned, filed in the United States Patent Office on Mar. 10, 1989 in the name of Henry S. Katzenstein and entitled "Analog-to-Digital Converter" and assigned of record to the assignee of record of this application. Application Ser. No. 321,992 is in turn a continuation-in-part of application Ser. No. 231,100 filed in the United States Patent Office on Aug. 11, 1988, now U.S. Pat. No. 4,928,102 issued May 22, 1990, in the name of Henry S. Katzenstein and entitled "Analog-to-Digital Converter" and assigned of record to the assignee of record of this application.

This invention relates to analog-to-digital converters and more particularly relates to analog-to-digital converters providing a particular non-linear output. More particularly, the invention relates to analog-to-digital converters providing particular non-linear output over a first voltage range and providing a linear output over a second voltage range.

Data processing systems operate on digital signals. However, the inputs to the data processing systems are generally analog. For example, parameters such as temperatures and pressures may be continuously measured in a system for manufacturing chemicals. These measurements have to be converted to a digital form before they can be introduced to the data processing system for processing by such system. Analog-to-digital converters have been in use for a considerable number of years to convert analog signals into a digital form.

There are two (2) important parameters in considering the performance of analog-to digital converters. These are (1) the speed of the conversion and (2) the resolution or accuracy with which the analog data is converted to a digital form. The converters now in use have been successful in accomplishing only one (1) or the other of these two (2) parameters.

In one type of converter, a plurality of comparators are employed to operate on a simultaneous—or parallel—basis. In order to provide an accuracy in the conversion, a large number of comparators have to be used. For example, when a conversion has to be made to twelve (12) binary bits, four thousand and ninety five (4095) comparators have to be used. As will be appreciated this causes the converter to be large, complex, expensive and difficult to produce.

In another type of converter, successive approximations are made to convert the analog value to the corresponding digital value. In each approximation, the value of successive bits of reduced binary significance is determined. This type of converter is relatively simple and can be quite accurate, particularly if the number of successive approximations is relatively large. However, this type of converter is slow. Furthermore, the time required to obtain a conversion increases as the accuracy of the conversion is increased.

One possible solution to the problems discussed above in analog-to-digital converters is to use a converter which has a logarithmic or exponential characteristic. In this type of converter, the resolution is made inversely proportional to the signal level. This results in a constant fractional resolution over the range of conversion. For most applications such as digitizing video information, this is satisfactory.

The desirability of providing an analog-to-digital converter with logarithmic or exponential characteristics has been known for some time. Because of this, a considerable effort has been made, and substantial amounts of money have been expended, to provide such a converter. In spite of such efforts and such considerable expenditures of money, the difficulties in providing a satisfactory analog-to-digital converter with logarithmic or exponential characteristics still remain.

Co-pending application Ser. No. 321,992 filed by me in the United States Patent Office on Aug. 11, 1988, for "Analog-to-Digital Converter" and assigned of record to the assignee of record of this application discloses and claims an analog-to-digital converter which has exponential characteristics and which overcomes the difficulties discussed above. The converter of this invention is fast, simple and inexpensive. It provides a resistive path which is relatively short and has equally spaced taps (or terminals) which provide voltages with an analog relationship. Furthermore, the converter may be constructed to provide a linear relationship at low voltages so as to provide a useable response in the vicinity of zero voltage input.

In one embodiment of the invention disclosed and claimed in application Ser. No. 321,992, a member has a thin film on its surface with substantially uniform electrically resistive characteristics. A plurality of terminals are disposed on the thin film at one side edge of the thin film. A reference potential such as an electrical ground is applied to the second side edge of the thin film. An energizing voltage is applied to the thin film either at one corner of the film or in a curved pattern of positions near such corner. In this way, voltages are produced at the successive terminals with an exponential relationship with respect to the position of the terminals. Alternatively stated, the successive terminals have a logarithmic relationship with respect to the voltages produced on such terminals.

When a linear relationship is desired between the voltages at the successive terminals in the low voltage range, the relationship between the position of the terminals and the reference potential electrode is altered. In one such embodiment, the reference potential is not applied to the second side edge of the thin film. Instead, the reference voltage may be applied to the edge opposite the corner receiving the energizing potential. In another such embodiment, no such reference voltage is applied but a row of terminals may be located across the width of the strip near its bottom edge to produce the linear relationship.

In the converter of co-pending application Ser. No. 321,992, a plurality of comparators are provided each connected to receive an input voltage and the voltage at an individual one of the successive terminals. The comparators provide an output indicative of the input voltage.

This application discloses and claims improvements in the converter of application Ser. No. 321,992.

In the drawings:

FIG. 4b is another embodiment for the same relationship as discussed above with respect to FIG. 4a;

Figure 1:
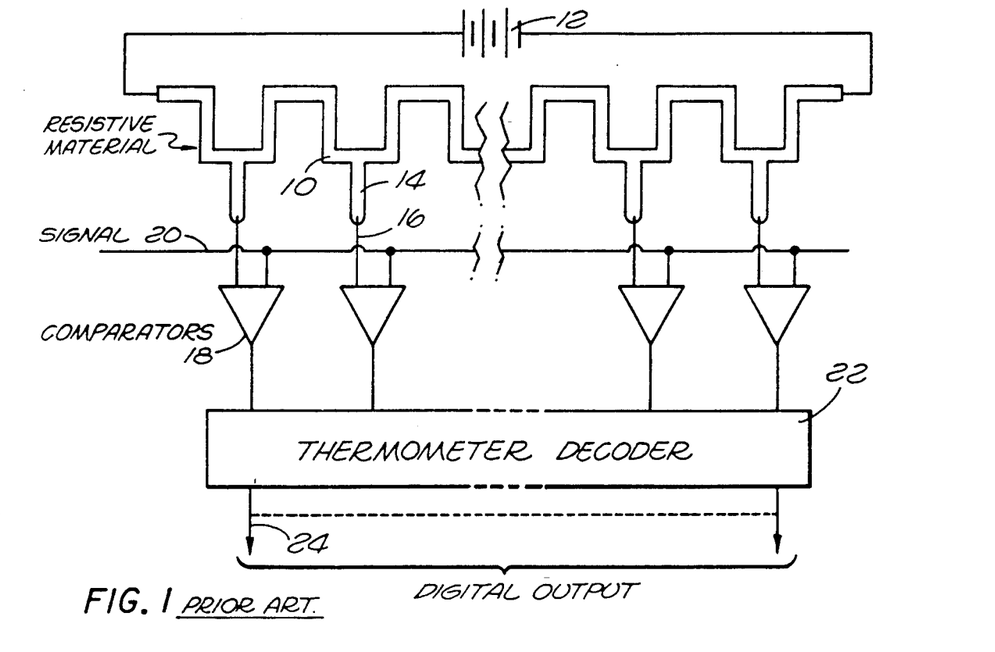
FIG. 1 is a schematic diagram of apparatus in the prior art for converting an analog voltage in a linear relationship to a corresponding digital voltage.

FIG. 1 illustrates one embodiment of the prior art for converting an analog voltage into a digital output at a plurality of terminals where the outputs at the successive terminals in the plurality have a linear relationship to one another. In the prior art embodiment shown in FIG. 1, a resistive element 10, such as an element made from a thin film of electrically conductive material, is connected at its opposite ends to a source of direct voltage such as a battery 12. As will be seen, the path of the resistive element 10 may be undulating to increase the length of the path within a confined space.

A plurality of terminals 14 are provided at equally spaced intervals along the resistive element 10. Leads 16 extend from the terminals 14 to first input terminals of comparators 18 which may be constructed in a conventional manner. A signal is applied through a line 20 to second input terminals of the comparators 18. The output signals from the comparators 18 are applied to a decoder 22 which may be constructed in a conventional manner. Output leads 24 extend from the decoder 22.

Since the terminals 14 are equally spaced along the length of the resistive element 10, the magnitudes of the voltages produced at the successive terminals 14 have a linear relationship to one another. The voltages on the terminals 14 are introduced to the comparators 18 for comparison with the signal on the line 20. The results of this comparison are indicated in a well known manner by the decoder 22. For example, when the voltage introduced to one of the comparators 18 from the associated terminal 14 is greater than the signal on the line 20, the comparator produces a positive output signal. The comparator 18 produces a negative output signal when the voltage introduced to the comparator 18 from the associated terminal 14 is less than the input signal.

The decoder 22 determines the position along the resistive element 10 where the voltage from one of two adjacent comparators is positive and the voltage from the other one of the two adjacent comparators is negative. The decoder then converts the voltage at this position along the resistive element 10 to a corresponding digital value at the output terminals 24.

The converter discussed above has certain significant disadvantages. In order to provide a conversion to a desired accuracy, a considerable number of terminals 14 have to be provided at spaced intervals along the resistive element 10. For example, to provide a resolution of twelve (12) binary bits, four thousand and ninety five (4095) terminals 14 and a corresponding number of comparators 18 have to be provided. As will be appreciated, this is difficult to accomplish in a limited space even with the most advanced techniques of producing integrated circuitry.

As a result, either the number of terminals 14 and the number of comparators 18 have to be reduced with a corresponding reduction in resolution or the size of the resistive element 10 has to be increased. Increasing the size of the resistive element 10 is contrary to the concerted attempts in the industry for years to reduce the size of electrical circuitry such as on integrated circuit chips or to pack circuitry with increased density on an integrated circuit chip of a given size.

Figure 2:
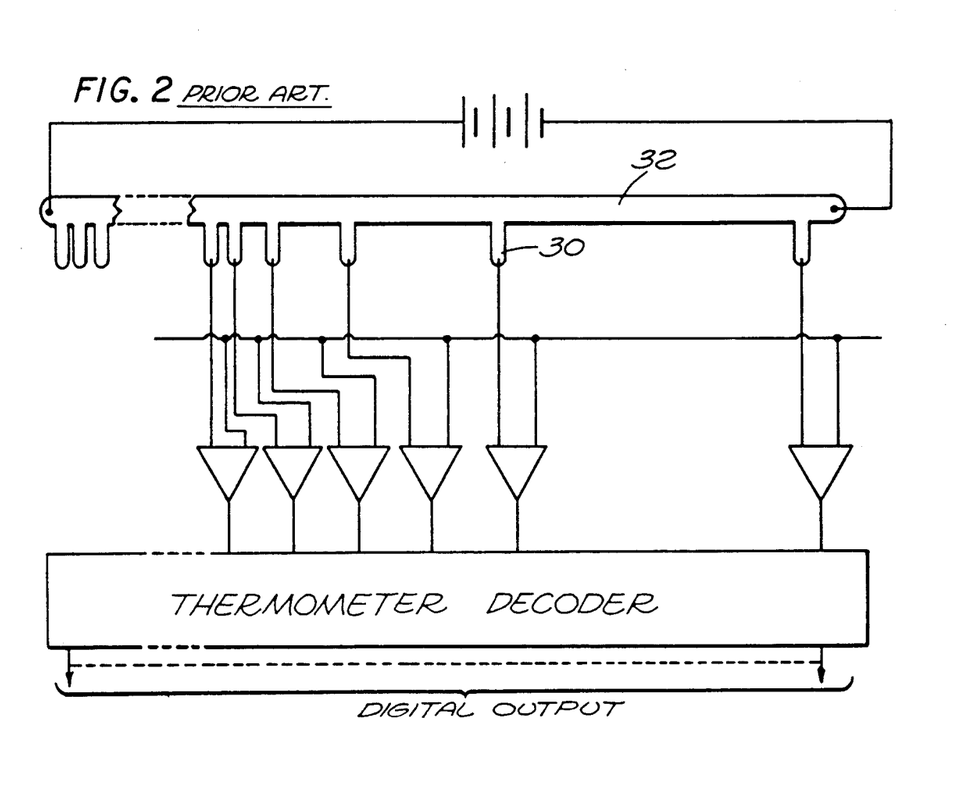
FIG. 2 is a schematic diagram of apparatus in the prior art for converting an analog voltage in a logarithmic relationship to a corresponding digital output.

FIG. 2 shows an analog-to-digital converter similar to that shown in FIG. 1. The converter shown in FIG. 2 is also well known in the prior art. However, the terminals 30 in FIG. 2 are not equally spaced along a resistive element 32 as in the embodiment shown in FIG. 1. Rather, the terminals 30 have a logarithmic spacing relative to one another along the resistive element 32. This causes the successive terminals 32 to provide voltages having a exponential relationship to one another.

As will be seen in FIG. 2, the spacing between the successive terminals 30 progressively decreases as the voltages on the terminals decreases. Thus, the terminals 30 become so closely spaced that it becomes difficult to separate them at low voltages. This limits the number of terminals that can be provided on the resistive element 32 and accordingly limits the resolution provided by the converter shown in FIG. 2.

Figure 3:
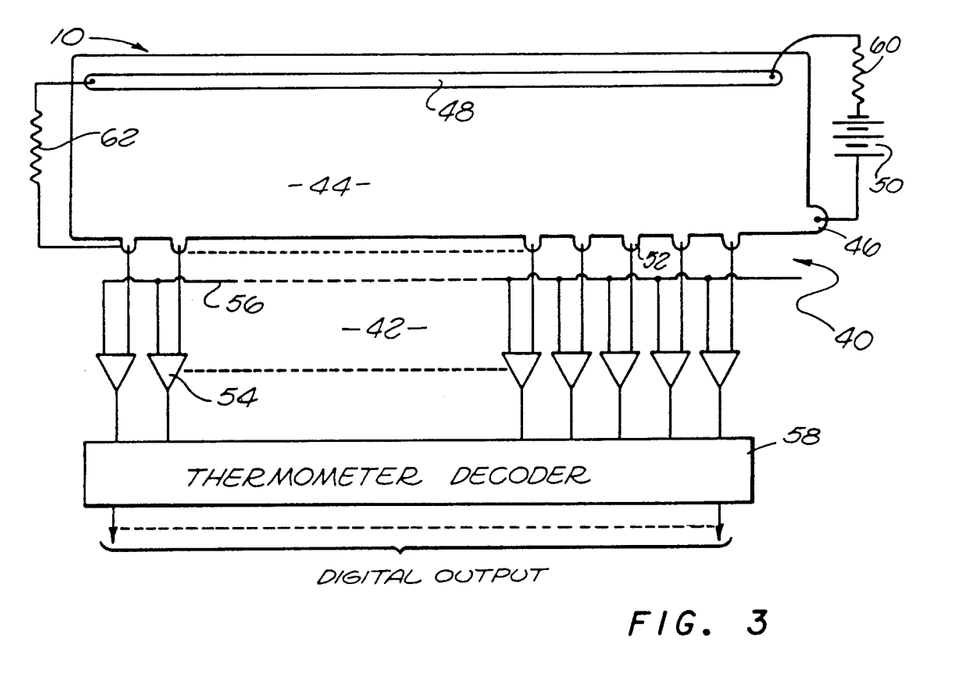
FIG. 3 is a schematic diagram of apparatus disclosed and claimed in co-pending application Ser. No. 321,992 for converting an analog voltage on an exponential basis to a corresponding digital output.

FIG. 3 illustrates one embodiment of an analog-to-digital converter, generally indicated at 40, disclosed and claimed in application Ser. No. 321,992. In this embodiment, a member 42 made from a suitable electrically insulating material is provided. A thin film 44 made from a suitable electrically resistive material is disposed on one surface of the member 42. Preferably the thin film 44 is rectangular in configuration and is provided with a substantially uniform electrical resistivity per unit area at the different positions on the film. The thin film 44 may be formed in a conventional manner as by diffusion, ion implantation of impurities into a semi-conducting substrate or vapor deposition of metal or semi-conductors on the member 42. The vapor deposition may be provided by evaporation, sputtering or chemical vapor deposition.

An ear 46 may be provided on the member 42 at the juncture between the top edge and the right side edge of the member and the thin film 44 may be disposed on this ear. A highly conductive strip 48 is disposed on the film 44 along the left edge of the thin film 44. A direct voltage such as from a battery 50 is applied between the thin film 44 at the position of the ear 46 and the conductive strip 48. Terminals 52 are disposed at equally spaced intervals along the right edge of the thin film. The terminals 52 are connected to first input terminals of comparators 54. Second input terminals of the comparators 54 receive an input voltage on a line 56. The outputs from the comparators 54 are applied to a decoder 58. The comparators 54, the line 56 and the decoder 58 may respectively correspond to the comparators 18, the line 20 and the decoder 22 in FIG. 1.

Although the terminals 52 are equally spaced along the right edge of the thin film 44, the magnitudes of the voltages produced at the successive terminals have an exponential relationship to one another with respect to the positions of such terminals. This may be seen from FIG. 8 where the effective series resistances between successive terminals 52a, 52b and 52c are respectively indicated at 60a and 60b and the effective shunt resistances between the conductive strip 48 and the terminals 52a, 52b and 52c are respectively indicated at 62a, 62b and 62c.

Figure 8:
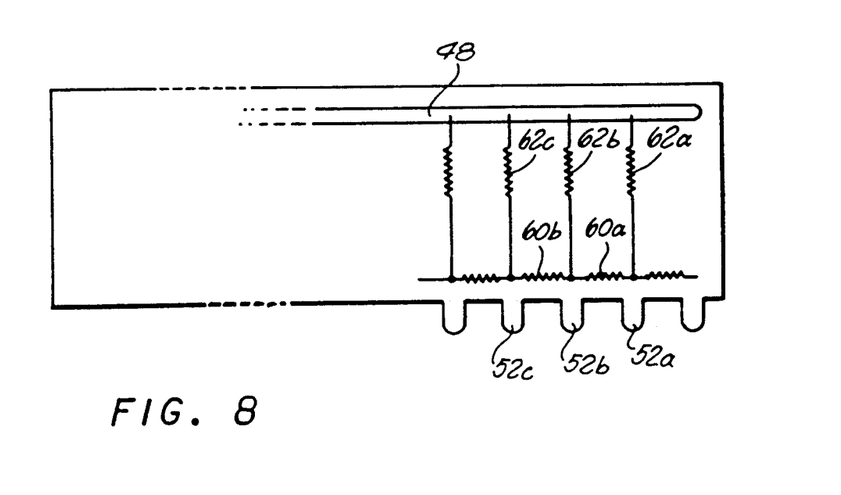
FIG. 8 is a schematic diagram showing apparatus including the converter shown in FIG. 3 for indicating in digital form the magnitude of an unknown input voltage.

As will be seen, the effective series resistances 60a and 60b between the terminals 52a and 52b and the terminals 52b and 52c have equal values and the resistances 62a, 62b and 62c also have equal values (different from the values of the resistances 60a and 60b). As a result, the ratio between the effective value of the resistance 62b and the sum of the values of the effective resistances 62b and 60a is the same as the ratio between the value of the effective resistance 62c and the sum of the values of the effective resistances 62c and 60b. This may be expressed mathematically as:

$$\frac{62b}{62b + 60a} = \frac{62c}{62c + 60b}$$

The constant ratio shown in the above equation establishes that the voltages on the terminals 52 have an exponential relationship with respect to the positions of the terminals even though the terminals 52 are equally spaced. In other words, the voltage distribution along the right side of the thin film 44 with respect to the positions of the terminals conforms substantially to the function $V = V_0 (e^{-ax})$ where "a" is an attenuation factor related to the aspect ratio (the ratio of the width to the height of the thin film 44), x is the distance along the lower edge of the thin film from the ear 46 and $V_0$ is the voltage at individual ones of the terminals 52 in FIG. 3. Solving this equation for x gives $x = 1/a$ (leg V/Va). This causes the progressive positions of the terminals 52 to have a logarithmic relationship with respect to the voltages produced on the terminals.

In one embodiment of the invention, the thin film 44 may constitute a rectangle of doped polysilicon film having a length-to-width ratio of approximately five to one (5:1). The resistivity may be in the order of one hundred (100) ohms per square. The voltage from the source 50 may be in the order of four (4) volts. Two hundred and thirty five (235) terminals 52 may be disposed at equally spaced positions along the right side edge of the thin film 44. The ratio between the voltages at successive terminals 52 will then be approximately 1.03:1. The voltage ratio between the top one and the bottom one of the terminals 52 in FIG. 3 will be approximately two thousand to one (2000:1).

It should be noted that the logarithmic characteristic of the converter shown in FIG. 3 and discussed above is not affected by a gradual variation in the resistivity of the thin film 44. Such a gradual variation may result from gradients induced in the thin film 44 during the process of forming the thin film on the supporting member. The logarithmic characteristic of the positions of the terminals 52 is unaffected by this gradual variation because the ratio of resistivities as discussed above remains substantially constant with such gradual variations in the resistivity of the thin film 44. Thus, the ratio of resistivities as discussed above will be affected only by higher order effects. For the same reasons as discussed above, the logarithmic characteristic of the thin film 44 is not affected by changes in the temperature of the thin film 44. In contrast, the linearity of a converter with linear characteristics is directly affected by gradual variations in the resistivity of the thin film 44 and by changes in the temperature of the thin film.

If desired, a resistance 60 may be disposed electrically between the positive terminal of the battery 50 and the ear 46, and a resistance 62 may be disposed electrically between the lowermost of the terminals 52 and the terminal 48. These resistances may be included to provide effective terminations for the resistance ladder defined by the thin film 44, the conductor 48 and the terminals 52. In this way, any fringe effects in the converter shown in FIG. 3 are minimized.

In some cases, it may be useful to make the distribution of voltages along the terminals 52 linear for some areas of the thin film 44 rather than exponential. In particular, it may be desirable to make the distribution of the low voltages linear rather than exponential. This may be desirable for low voltages since the logarithm of zero (0) is not defined. Furthermore, a logarithmic relationship between the spacing of the terminals 52 at the low end of the voltage range may be undesirable because of the close spacing between voltage levels, needlessly increasingly the number of comparators.

Figure 4A:
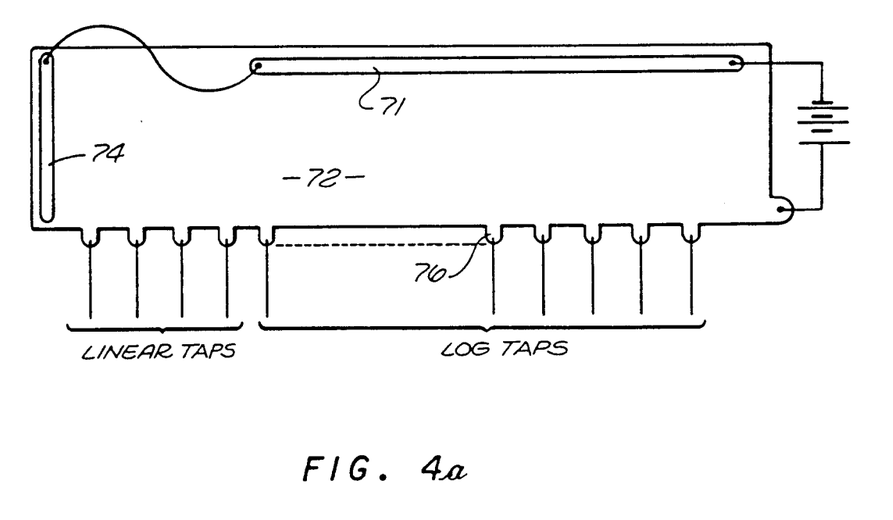
FIG. 4a is a schematic diagram of apparatus disclosed and claimed in co-pending application Ser. No. 321,992 for converting an analog voltage to a corresponding digital voltage on an exponential basis for high analog values and in a linear relationship for low analog values.

The embodiment shown in FIG. 4a provides a logarithmic relationship between the position of the terminals 70 and the voltage at the high end of the voltage range and a linear relationship between the position of the terminals and the voltage at the low end of the voltage range. In the embodiment shown in FIG. 4a, a highly conductive strip 71 (corresponding to the conductive strip 48 in FIG. 3) is provided along a portion of the distance between the top and bottom of a thin film 72. The distance of the conductive strip 70 corresponds to the distance in which the thin film 72 acts to provide a logarithmic conversion. In addition, a conductive strip 74 may be disposed on the thin film 72 at the bottom edge of the thin film.

Figure 6:
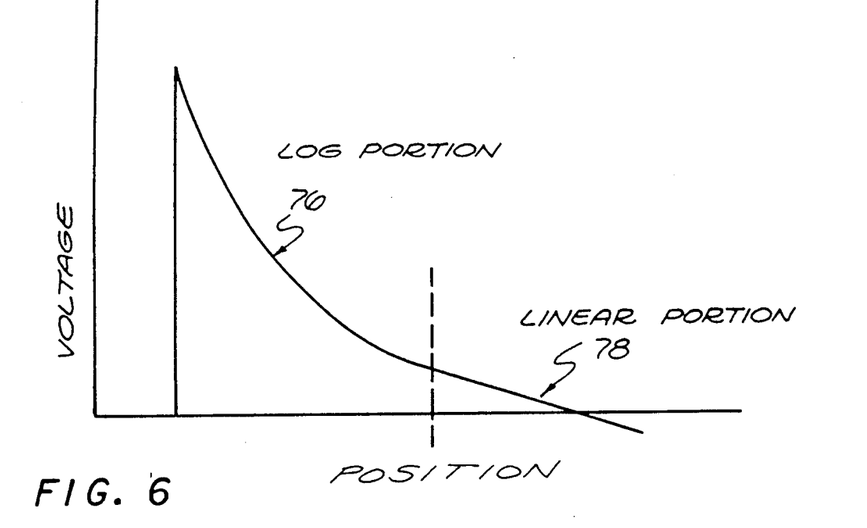
FIG. 6 is a curve showing the magnitude of the analog voltage produced at different positions in a member included in the converter shown in FIG. 4.

As will be seen in FIG. 6, voltages having an exponential relationship with respect to the positions of the successive terminals 70 are produced at such successive terminals on the portion of the thin film 72 corresponding to the positioning of the conductive strip 71. This is indicated at 76 in FIG. 6. In the portion of the thin film 72 below the conductive strip 70, a voltage having a linear relationship with respect to the positions of successive terminals is produced at such successive terminals of the thin film. This results from the disposition of the conductive strip 74 on the thin film at the bottom edge of the thin film in FIG. 4. The linear relationship of the voltage at successive terminals at the low end of the voltage ranges is indicated at 78 in FIG. 6.

Figure 4B:
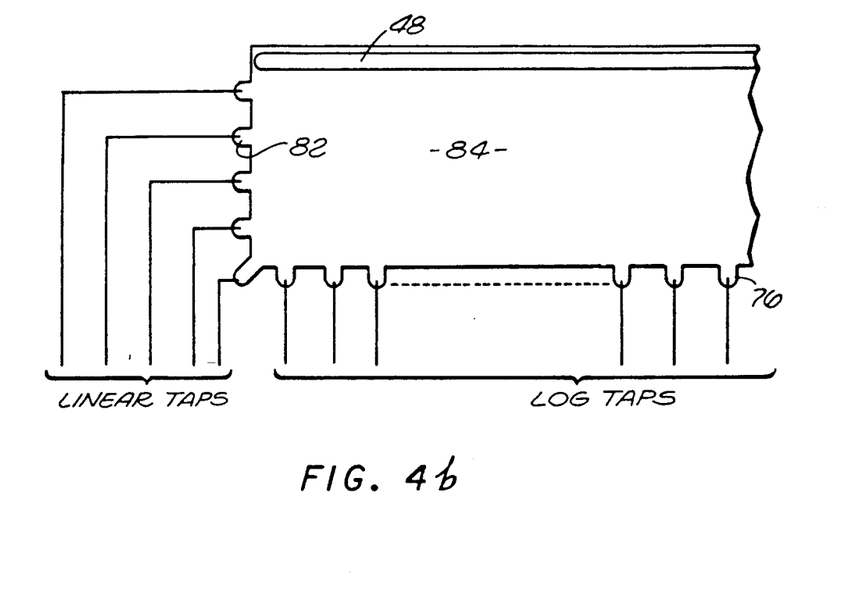

The embodiment shown in FIG. 4b provides the same results as the embodiment shown in FIG. 4a but in a somewhat different manner. The embodiment shown in FIG. 4b is substantially the same as the embodiment shown in FIG. 3. However, terminals 82 are equally spaced along the bottom surface of a thin film 84. As a result, a voltage having an exponential relationship with respect to the positions of successive terminals 76 along the side edge of the thin film 84 is provided at such successive terminals. However, a voltage having a linear relationship with respect to the positions of the successive terminals 82 along the bottom surface of the thin film is provided at such successive terminals.

Even though a converter constructed to have logarithmic characteristics for the positions of the terminals 52 with respect to the voltages produced at such terminals may be affected only slightly by process gradients, there may still be errors in the logarithmic characteristics at successive ones of the terminals such as the terminals 52 in FIG. 3. For example, errors may result from small local defects in the semi-conductor materials, distortions in the characteristics of the thin film 44 as a result of lithographic errors in the placement of the terminals 52 and the influence from the process for manufacturing the terminals 52. As a result, it may be desirable to calibrate the converter at the time of final test of the converter or to perform a calibration every time that the converter is to be operated.

Figure 5:
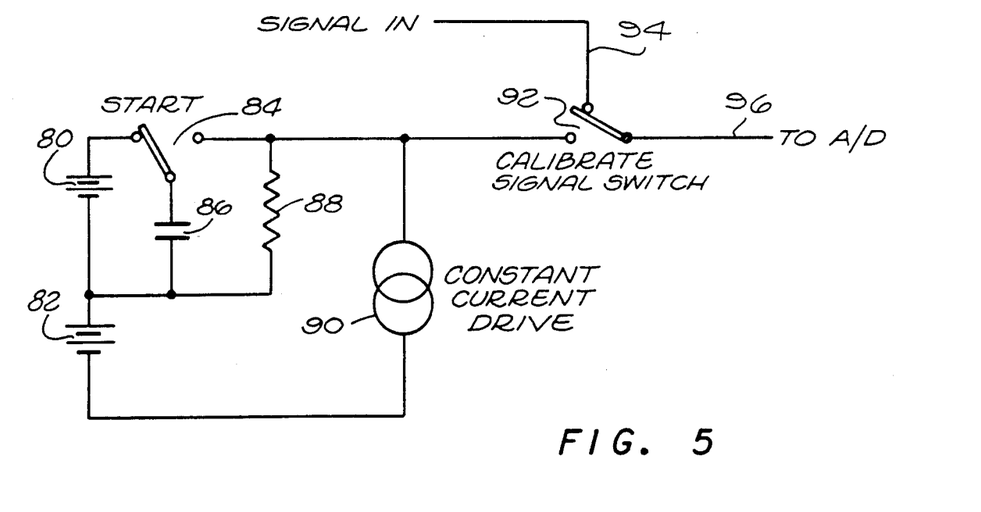
FIG. 5 is a schematic diagram of electrical circuitry for calibrating the converter shown in FIG. 4.

FIG. 5 illustrates a system for calibrating a converter such as shown in FIGS. 4a on 4b. In FIG. 5, sources of direct voltage such as batteries 80 and 82 are connected in series. The positive terminal of the battery 80 is common with a first stationary terminal of a switch 84. A connection is made from the movable arm of the switch 84 to one terminal of a capacitance 86, the other terminal of which is common with the negative terminal of the battery 80. A resistance 88 is connected between a second stationary terminal of the switch 84 and the negative terminal of the battery 80.

A source 90 of a substantially constant current is connected between the second stationary terminal of the switch 86 and the negative terminal of the battery 82. The voltage on the second stationary terminal of the switch 84 is introduced to one stationary terminal of a switch 92 in FIG. 5. The second stationary terminal of the switch 92 receives an input signal on a line 94. The movable arm of the switch 92 is connected to a line 96 corresponding to the line 56 in FIG. 3.

When the movable arm of the switch 84 engages the left stationary terminal of the switch, the capacitance 86 is charged by the battery 80 to a voltage corresponding to the voltage across the battery 80. When the movable arm of the switch 84 engages the right stationary terminal of the switch 84, the capacitance 86 discharges through the resistance 88. As the capacitance 86 discharges, it produces an exponentially decaying voltage corresponding to the portion 76 of the curve in FIG. 6.

With the movable arm of the switch 92 engaging the lower stationary terminal in FIG. 5, the decaying voltage across the capacitance 86 is introduced to the line 96 (corresponding to the line 56 in FIG. 3) for comparison with the voltages on the terminals 76 in FIGS. 4a and 4b. As the voltage across the capacitance 86 decays, it matches the voltage on progressive ones of the terminals 76. An output signal is accordingly produced by the decoder 58 every time that such a matching voltage occurs. This matching voltage decreases in equal time increments as indicated at 96 in FIG. 7 when the characteristics of the resistance are linear at different positions on the thin film 44.

Figure 7:
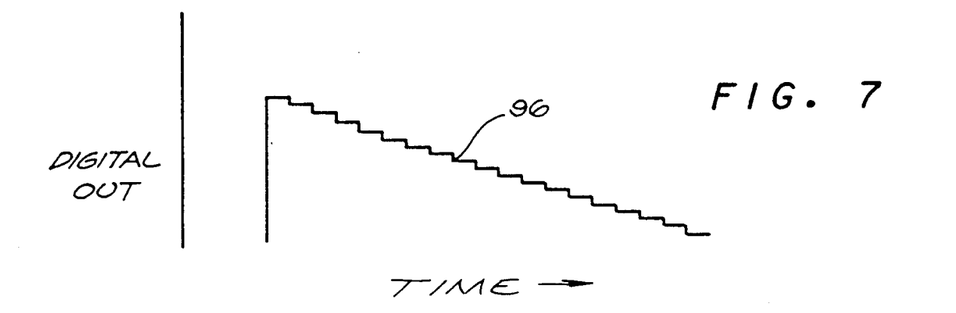
FIG. 7 is a curve showing the relationship between the voltages produced at successive terminals in the converter of FIG. 4 and the time for producing such voltages.

If there are no deviations in the thin film 44 to produce errors in the logarithmic characteristics, every one of the steps in the curve 96 in FIG. 7 will have an equal time increment. However, if the thin film 44 produces errors in the logarithmic characteristic, this will cause deviations to be produced from the equal time increments in FIG. 7. The position of the increment in the curve shown in FIG. 7 will indicate where the errors in the thin film 44 are located. The deviations from equal time increments in the curve shown in FIG. 7 will indicate the extent of each such error. A microprocessor (not shown) can then be programmed to compensate for such errors so that a truly logarithmic relationship can be provided by the converters shown in FIG. 4a and 4b.

The circuitry shown in FIG. 5 is also operative to calibrate the linear portion 78 of the curve shown in FIG. 6. When the capacitance 86 has discharged to a voltage level corresponding to the voltage level at the juncture between the portions 76 and 78 of the curve shown in FIG. 6, the constant current source 90 in FIG. 5 becomes effective in producing a further discharge of the capacitance. The constant current source may be a field effect transistor or may be any other member well known in the art to provide a constant current when a voltage is applied to it.

As the capacitance 86 discharges through the constant current source 90, the decaying voltage across the capacitance is introduced to a line corresponding to the line 56 in FIG. 3 for comparison with the voltages on the terminals 76 in FIG. 4a on the terminals 82 in FIG. 4b. An output voltage is accordingly produced by the decoder every time that the voltage from the capacitance 86 matches the voltage on one of the terminals 76 or 82. The time for the production of the matching voltages produces a calibration of the voltage on such terminal.

Figure 9:
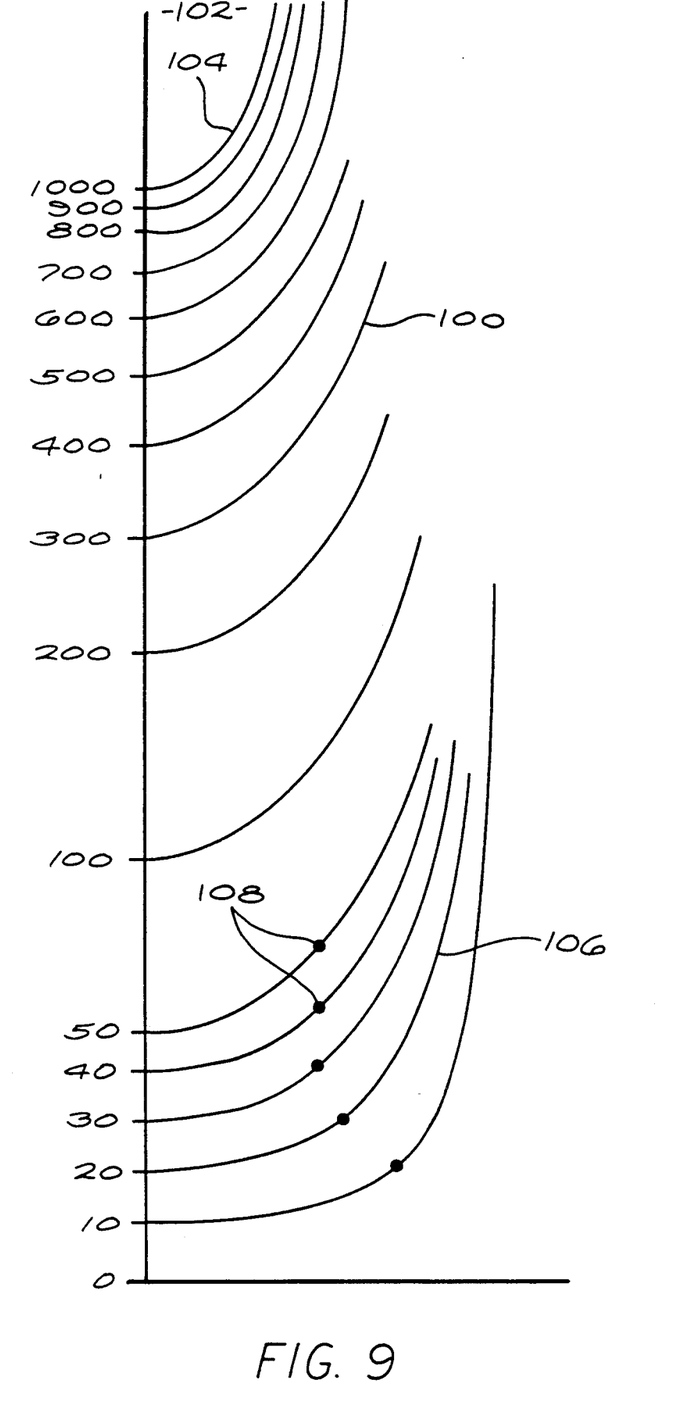
FIG. 9 illustrates a pattern of voltage produced on a logarithmic basis on a thin film.

FIG. 9 illustrates the pattern of voltages produced on an exponential basis at progressive positions on the thin film 44 of the member 42. As illustrated at 100, the voltages are produced in curved patterns extending from the left border to the top border of the member 42. The different voltages produced in this pattern are illustrated at progressive incremental steps of "100" between analog values of 100 and 1000.

As will be seen, a blank area 102 exists in FIG. 9 at the upper left corner of the member 42. A constant voltage may be produced in this area. Because of this, the area 102 may be made conductive without affecting the operation of the member. Furthermore, the positive direct voltage from the battery 50 may be applied along the line 104 representing the maximum voltage of "1000" in FIG. 9.

FIG. 9 also illustrates the pattern of exponential voltages at the top of the member 42 and the pattern of linear voltages at the bottom of the member. The pattern of the linear voltages is illustrated at 106 in FIG. 9. To increase the spacings between the taps for the linear voltages, the taps may be staggered in position as illustrated at 108 in FIG. 9. The low voltages are indicated in increments of "10" between 0 and 100. The high voltages are illustrated in increments of "100" between 200 and 1000.

Figure 10:
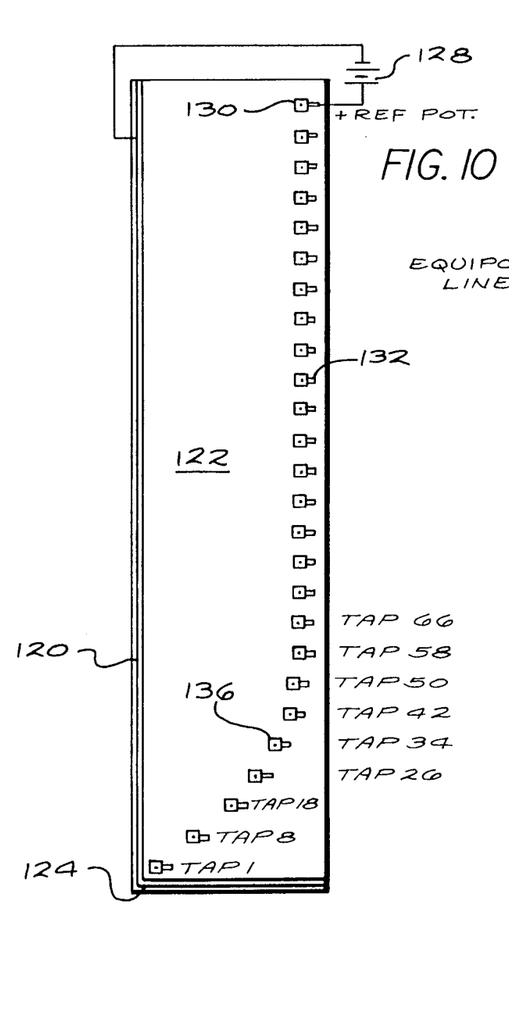
FIG. 10 is a schematic diagram of apparatus constituting one embodiment of the invention for converting an analog voltage to a corresponding digital voltage on an exponential basis for high analog values and in a linear relationship for low analog values.

FIG. 10 illustrates one embodiment of the invention. In the embodiment shown in FIG. 10, a highly conductive strip 120 is disposed along one edge such as the left side edge of a resistive surface 122. As will be seen, the strip 120 extends along the full dimension of the side edge. A highly conductive strip 124 communicates with the strip 120 and extends along the full width of the resistive surface 122. A positive potential from a power supply such as a battery 128 is applied at a terminal 130 at the upper right edge of the resistive surface 122 and the negative terminal of the battery 128 is common with the highly conductive strips 120 and 124. Resistances corresponding to the resistances 60 and 62 (FIG. 3) may be provided in the embodiment shown in FIG. 10.

Figure 11:
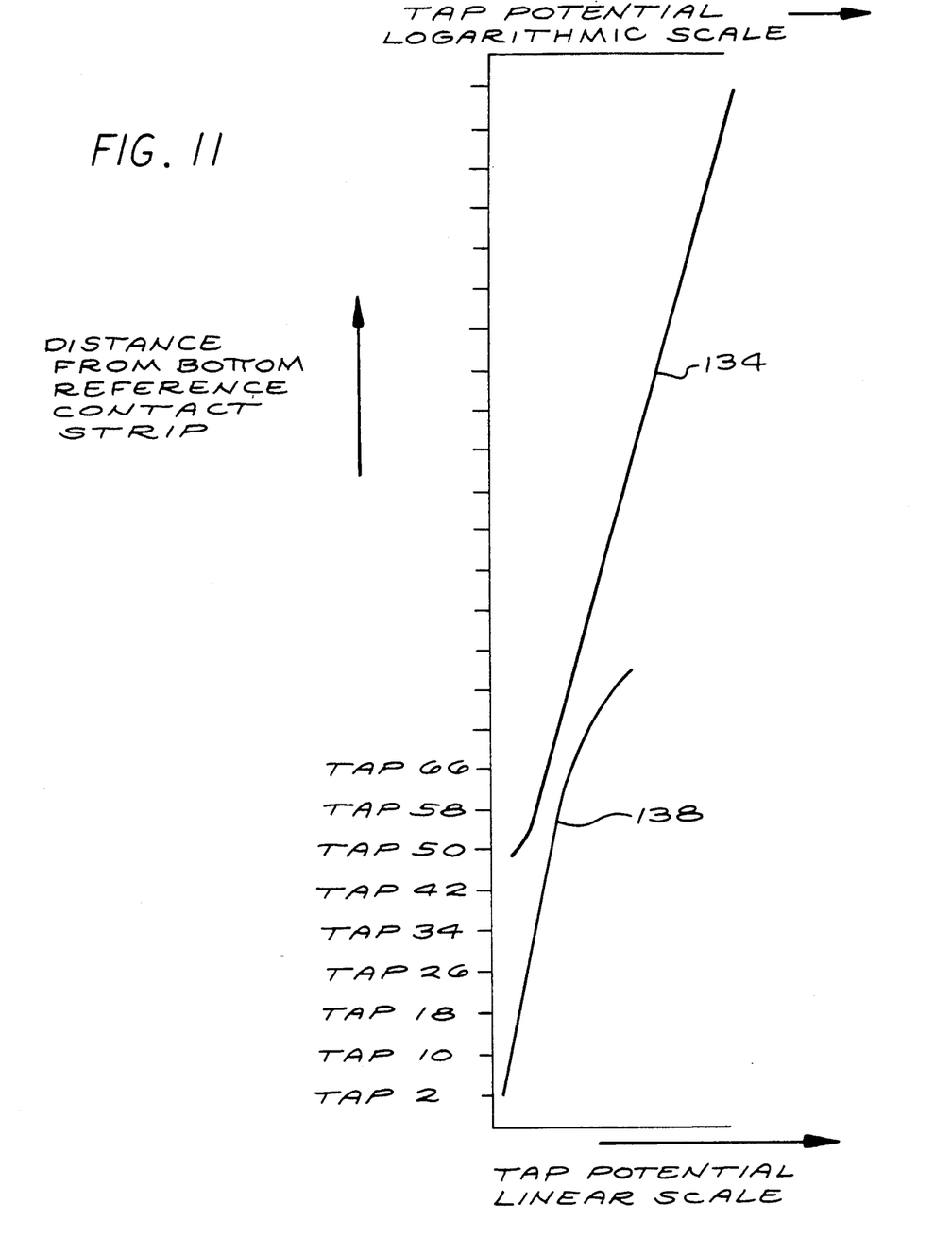
FIG. 11 is a schematic diagram illustrating the pattern of voltages ideally produced at the top for the exponential range of voltages and at the bottom for the linear range of voltages.

Terminals 132 are disposed at progressive positions downwardly from the top of the resistive surface 122. The terminals 132 are preferably equally spaced downwardly and are preferably disposed at the right edge of the resistive surface 122. As shown in FIG. 11, a voltage curve 134 is produced on a logarithmic scale in the upper portion of the resistive surface 122. The curve 134 constitutes a potential gradient of the voltage at different positions on the resistive surface 122 and indicates that the voltage on a logarithmic scale progressively decreases linearly with successive terminals equally displaced downwardly from the top edge of the resistive film.

Terminals 136 are disposed at progressive positions downwardly near the bottom of the resistive surface 122. The terminals are preferably equally spaced downwardly and are preferably displaced progressively from the right edge of the thin film 122. As shown in FIG. 11, a voltage curve 138 is produced on a linear scale in the bottom portion of the resistive surface 122. The curve 138 constitutes a potential gradient of the voltage at different positions on the resistive surface 122 and indicates that the voltage progressively decreases linearly with successive terminals equally displaced downwardly near the bottom edge of the resistive film. These terminals are indicated in FIGS. 10 and 11 by tap numbers such as "tap 2" and "tap 10".

By progressively displacing the terminals 136 inwardly from the right edge, the spacing between adjacent terminals can be effectively increased. This increased spacing provides for a more accurate positioning of the terminals than the positioning of the corresponding terminals in the previous embodiments. This in turn provides for an enhanced linear response relative to that in the previous embodiments.

Figure 12:
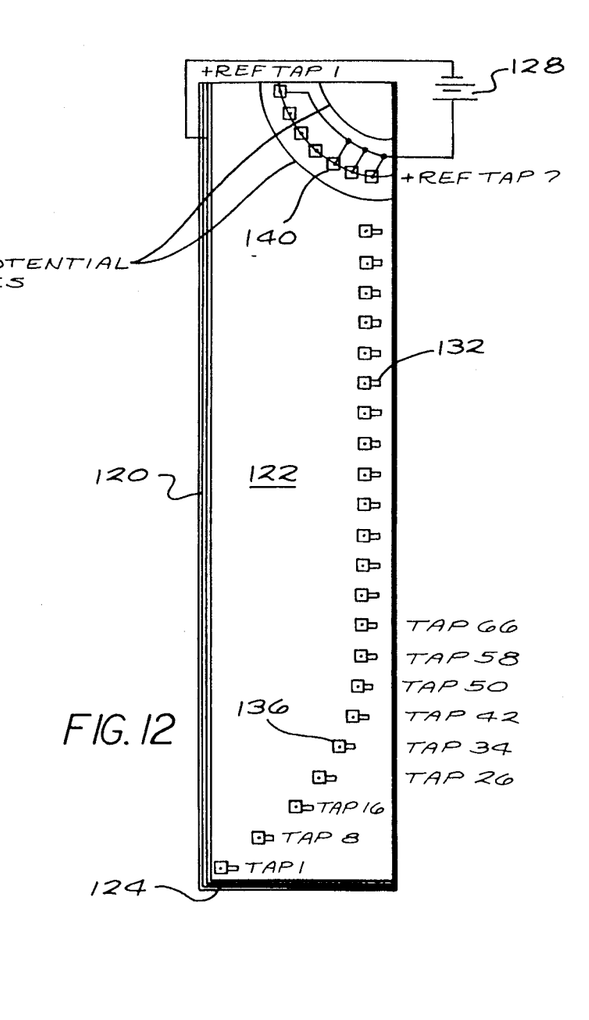
FIG. 12 is a schematic diagram of a modification of the embodiment shown in FIG. 10 to apply an energizing voltage on a parallel basis at a plurality of spaced taps.

The embodiment shown in FIG. 12 is substantially identical to the embodiment shown in FIG. 10 except that the positive potential from the battery 128 is applied to a plurality of terminal 140 disposed in a curve extending from a position at the top of the resistive surface 122 near the right top corner to a position at the right side near the right top corner. The terminals 140 are at positions where the resistive surface 122 has an isopotential relationship. By introducing the positive voltages from the battery 128 to the terminals 140, the impedance provided by the terminals 140 in parallel is effectively reduced relative to the impedance provided by the terminal 130. The arrangement shown in FIG. 12 also tends to decrease the effect of contact spreading resistance on the thin film 122.

Figure 13:
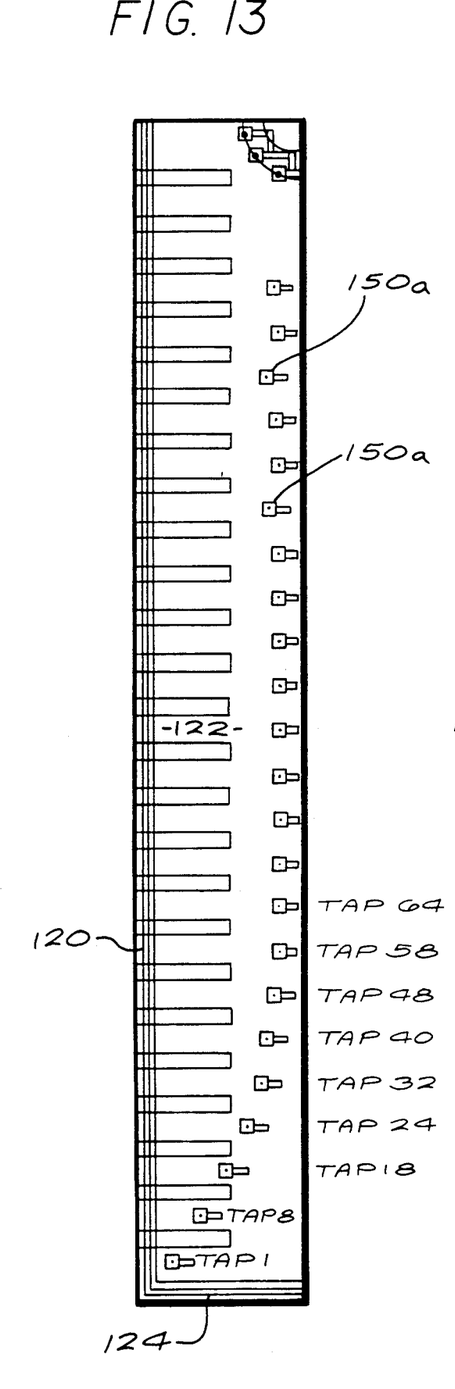
FIG. 13 is a schematic diagram of another modification of the embodiment shown in FIG. 10 for correcting for aberrations in the voltage characteristics of an electron in a cathode ray tube.

It may sometimes happen that the output member receiving the voltage from one of the embodiments such as the embodiments shown in FIGS. 10 and 12 may have a variable response for different magnitudes of voltages. For example, the output member may be an electron gun of a cathode ray tube. At one magnitude of voltage, the electron gun may illustratively have one a first response and, at another magnitude of voltage, the electron gun may illustratively have another response. To compensate for these differences, some of the terminals 150 in the embodiment of FIG. 13 may be displaced inwardly from the right edge of the resistive surface 122. These terminals are illustratively indicated at 150a in FIG. 13. The amount of inward displacement of these terminals is dependent upon the compensation to be provided at these terminals. In this way, all of the terminals will provide a desired response to the electron gun voltages.

Figure 14:
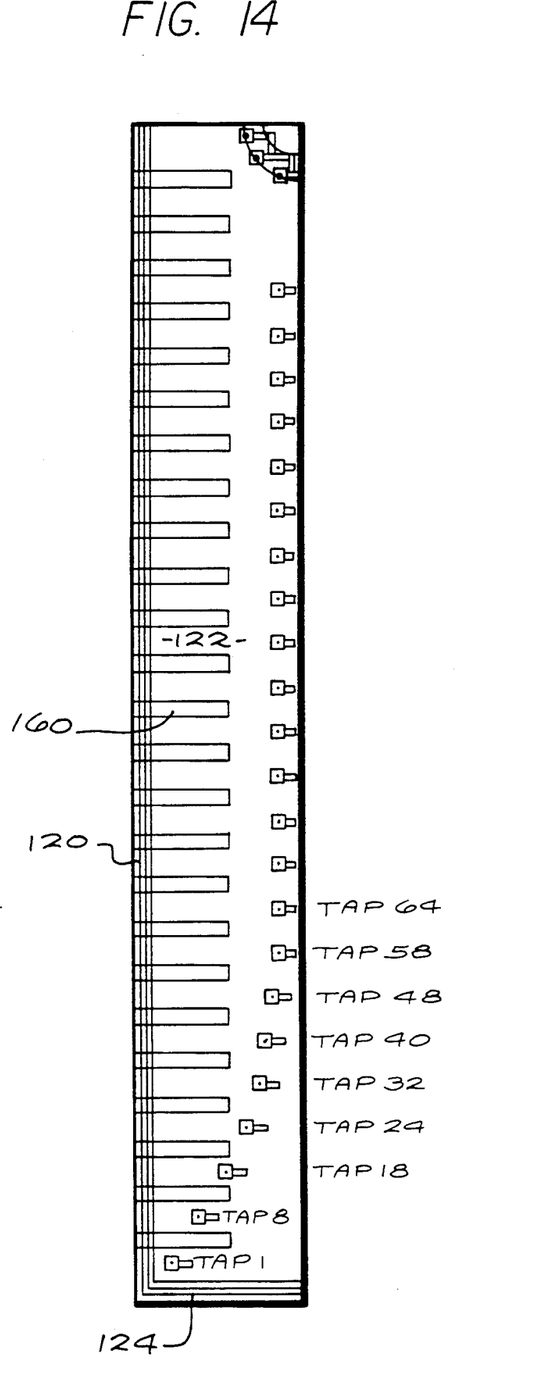
FIG. 14 is a schematic diagram of another embodiment of the invention for reducing the dimensions of such embodiment relative to the dimensions of the embodiments shown in FIGS. 10, 11 and 13.

FIG. 14 schematically illustrates an embodiment in which the width of the resistive surface 122 is decreased. This is accomplished by providing cuts 160 in the resistive surface 122. Each of the cuts has a small dimension in the vertical direction and a relatively large dimension in the horizontal direction. The cuts tend to increase the values of the resistances 62a, 62b, etc., shown in FIG. 8. However, the values of the resistances 60a, 60b, etc., in FIG. 8 tend to remain constant. Thus, for a constant value in the equation specified above, the horizontal width of the resistive surface 122 is decreased. Alternatively, for a constant horizontal width of the resistive surface 122, the logarithmic function is changed.

The apparatus described above has certain important advantages. In one embodiment, it provides voltages with an exponential relationship with respect to a plurality of evenly spaced terminals. These terminals have a logarithmic relationship with respect to the voltages produced on the terminals. In another embodiment, it provides voltages with such an exponential relationship at a first plurality of evenly spaced terminals in a first portion of a member and provides voltages with a linear relationship at a second plurality of evenly spaced terminals in a second portion of the member. Preferably the voltages from the first plurality of terminals have relatively high magnitudes and the voltages from the second plurality of terminals have relatively low magnitudes. Furthermore, in one embodiment, the spacing between the terminals in the second plurality can be increased. In another embodiment, the terminals in the first plurality can be disposed to compensate for aberrations in the characteristics of an output member to which the terminal voltages are applied. In still another embodiment, the width of the resistive member can be minimized.

The apparatus described above is formed in a relatively simple manner as by disposing a substantially uniform resistive film on a member and by applying voltages in a particular manner to the member. The outputs from such a member are substantially independent of changes in the resistivity of the thin film at different positions on the member since the changes generally occur progressively in a substantially uniform manner at successive positions on the thin film. The outputs from such a member are also substantially independent of temperature variations.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. In combination in an analog-to-digital converter, a member provided with an electrically resistive material on one surface of the member, the member being defined by first and second side edges and top and bottom edges, means for providing a reference voltage on the resistive material along the first side edge of the member, means for providing an energizing voltage on the resistive material at particular positions near the corner displaced from the first side edge of the resistive material, means for obtaining a logarithmic output voltage on the resistive material at first positions progressively disposed along the second side edge of the resistive material, and means for obtaining a linear output voltage on the resistive material at second positions displaced progressively from the second side edge of the resistive material.

2. In a combination as set forth in claim 1, means for providing an input voltage, and means for comparing the input voltage with the output voltage at the first and second positions on the resistive material to provide an indication of the input voltage.

3. In a combination as set forth in claim 2, the first progressively disposed positions being substantially equally spaced along the second side edge of the resistive material to provide an exponential relationship in the voltage at the first progressively disposed positions on the resistive material and the second progressively disposed positions on the resistive material being substantially equally spaced to provide a linear relationship in the voltage at the second progressively disposed positions on the resistive material.

4. In a combination as set forth in claim 3, the reference voltage being an electrical ground and the energizing voltage being a voltage with a particular magnitude, and the reference voltage being provided along the first side edge of the resistive material and along the edge of the resistive material opposite the particular positions where the energizing voltage is provided on the resistive material.

5. In combination in an analog-to-digital converter, a substantially planar member having first and second opposite edges and having top and bottom edges, an electrically resistive element disposed on the surface of the planar member, a first plurality of terminals at equally spaced positions along one of the side edges of the resistive element to provide a voltage having an exponential relationship at progressive ones of such terminals along such side edge, a second plurality of terminals at equally spaced positions extending progressively inwardly from the one edge of the resistive element to provide a voltage having a linear relationship at progressive ones of such terminals, and means for providing an energizing voltage to the resistive element to obtain voltages in a magnitude having an exponential relationship at the progressive terminals in the first plurality and to obtain voltages in a magnitude having a linear relationship at the progressive terminals in the second plurality.

6. In a combination as set forth in claim 5, the resistive element constituting a thin substantially uniform layer of an electrical resistance material on the member.

7. In a combination as set forth in claim 6, a plurality of comparators having first and second input terminals, means for applying an input voltage to the first input terminal of each of the comparators, means for applying the voltage on each individual terminal on the resistive material to the second input terminal of an individual one of the comparators, and means for determining the input voltage from the outputs of the comparators.

8. In a combination as set forth in claim 7, the voltage means providing the energizing voltage at the resistive element on particular positions relative to the terminals on the one side edge of the resistive element.

9. In a combination as set forth in claim 8, means for applying a ground voltage to the side edge of the resistive element opposite the one side edge of the resistive element, and the energizing voltage being provided on the resistive element at particular positions near a corner of the resistive element adjacent the one side edge of the resistive element.

10. In a combination as set forth in claim 6, means for applying a reference voltage to the side edge of the resistive element opposite the one side edge of the resistive element and to the particular one of the top and bottom edges opposite the particular positions on the resistive element where the energizing voltage is provided on the resistive element.

11. In combination in an analog-to-digital converter, a member having an electrically resistive surface and having first and second opposite side edges and top and bottom edges, a plurality of terminals disposed at particular positions relative to the first side edge of the electrically resistive surface in equally spaced relationship to one another, some of the terminals being displaced inwardly by particular distances from the first side edge of the electrically resistive surface, means associated with the electrically resistive surface for producing, at first successive terminals in the plurality, voltages having an exponential relationship with respect to the positions of such successive terminal, and means associated with the electrically resistive surface for producing, at second successive terminals in the plurality, voltages having a linear relationship with respect to the positions of such second successive terminals, the second successive terminals on the member being displaced from the first successive terminals on the electrically resistive surface in the direction between the top and bottom edges of the electrically resistive surface.

12. In a combination as set forth in claim 11, means for applying a reference voltage to the second side edge of the electrically resistive surface at positions opposite the first and second successive terminals.

13. In a combination as set forth in claim 12, means for applying the reference voltage to the particular one of the top and bottom edges of the electrically resistive surface closest to the second successive terminals.

14. In a combination as set forth in claim 11, the reference voltage means extending along the length of the second side edge of the electrically resistive surface, individual ones of the first successive terminals being displaced inwardly on the resistive surface from the first side edge of the resistive surface.

15. In a combination as set forth in claim 14, means for applying the reference voltage to the particular one of the top and bottom edges of the electrically resistive surface closest to the second successive terminals, individual ones of the second successive terminal being displaced inwardly on the resistive surface from the first side edge of the resistive surface.

16. In a combination as set forth in claim 15, the electrically resistive surface on the member being in the form of a thin film having substantially constant electrical characteristics at different positions on such surface, the second successive terminals being displaced progressively inwardly on the resistive surface from the first side edge of the resistive surface to provide an equally spaced relationship between such successive terminals.

17. In combination in an analog-to-digital converter, a planar member defined by first and second side edges and top and bottom edges, a thin film of an electrically resistive material disposed substantially uniformly on the member, a plurality of terminals disposed on the member relative to the first side edge of the member in equally spaced relationship to one another and in electrical communication with the thin film of the electrically resistive material, the thin film being cut from the first side edge of the thin film through a distance partially toward the second side edge of the thin film and in a direction substantially parallel to the top and bottom edges of the thin film, means for introducing an energizing voltage on the thin film to obtain the production on successive terminals in the plurality voltages having an exponential relationship with respect to the positions of such successive terminals on the member.

18. In a combination as set forth in claim 17, the successive terminals in the plurality being disposed in first and second groups, the successive terminals in the first group being disposed relative to the second side edge of the thin film to provide an exponential function of voltage at such successive terminals, the successive terminals in the second group being displaced progressively inwardly from the second side edge of the thin film to provide a linear function of voltage at such successive terminals.

19. In a combination as set forth in claim 18, means for providing an input voltage, and a plurality of comparators each connected to the input voltage means and to an individual one of the successive terminals in the plurality to co-operate with the other comparators in providing an indication of the value of the input voltage, individual ones of the successive terminals in the first group being displaced inwardly from the second edge of the thin film to enhance the provision of the exponential function of the voltage at the successive terminals in the first group.

20. In a combination as set forth in claim 17, means for applying a reference voltage to the first side edge of the thin film along the length between the top and bottom edges of the thin film, the energizing voltage means applying the energizing voltage near the juncture of the second side edge of the thin film with one of the top and bottom edges of the thin film.

21. In a combination as set forth in claim 19, the first side edge of the thin film receiving a reference voltage, means for providing the energizing voltage to the thin film at positions near the juncture between the second side edge of the thin film and the top edge of the thin film, a third group of terminals disposed in a curved relationship near the juncture of the second side of the thin film with one of the top and bottom edges of the thin film, the energizing voltage means applying the energizing voltage to the terminals in the third group, and means for applying the reference voltage to the particular one of the top and bottom edges opposite the terminals in the third group.

22. In a combination as set forth in claim 19, means for providing an input voltage, and a plurality of comparators each connected to the input voltage means and to an individual one of the successive terminals in the plurality to co-operate with the other comparators in providing an indication of the value of the input voltage, individual ones of the successive terminals in the first group being displaced inwardly from the second side edge of the thin film to enhance the provision of the exponential function of the voltage at the successive terminals in the first group.

23. In combination in an analog-to-digital converter, a planar member defined by first and second side edges and top and bottom edges, a thin film of an electrically resistive material disposed substantially uniformly on the member, means for applying a reference voltage to the first side edge of the thin film along the first side edge, a first plurality of terminals disposed on the thin film relative to the second side edge of the member in equally spaced relationship to one another and in electrical communication with the thin film of the electrically resistive material, means for providing a voltage between the top of the thin film and the first side edge of the thin film to obtain an exponential relationship of the voltages at the terminals in the first plurality, and a second plurality of terminals disposed progressively on the thin film relative to the terminals in the first plurality to obtain a linear relationship of the voltages at the progressive terminals in the second plurality, the terminals in the second plurality being displaced progressively inwardly from the second side edge of the thin film in equally spaced relationship to one another.

24. In a combination as set forth in claim 23, the terminals in the first plurality on the thin film providing higher voltages than the terminals in the second plurality on the thin film, and means for applying the reference voltage along the bottom edge of the thin film.

25. In a combination as set forth in claim 24, individual ones of the terminals in the first plurality being disposed inwardly from the second side edge of the thin film to compensate for deviations in the output member from an exponential response.

26. In a combination as set forth in claim 25, means for providing an energizing voltage to the thin film at particular positions near the juncture between the second side edge of the thin film and the particular one of the top and bottom edges of the thin film closest to the terminals in the first plurality.

27. In a combination as set forth in claim 26, cuts being provided in the thin film at the first side edge of the thin film, the cuts extending partially toward the second side edge of the thin film and being disposed at progressive positions along the first side edge of the thin film.

28. In a combination as set forth in claim 27, means for providing an input voltage, and a plurality of comparators each responsive to the input voltage and to the voltage at an individual one of the terminals in the first and second pluralities for cooperating with the other comparators in providing an indication of the magnitude of the input voltage.

29. In combination in an analog-to-digital converter, a member provided with an electrically resistive material on one surface of the member, the member being defined by first and second side edges and top and bottom edges, means for providing a reference voltage on the resistive material along the first side edge of the member, means for providing an energizing voltage on the resistive material at particular positions near the corner displaced from the first side edge of the resistive material, means for obtaining an output voltage at progressive positions along the second side edge of the resistive material, means for providing an input voltage, and means for comparing the input voltage with the output voltage at the progressive positions relative to the second side edge of the resistive material to provide an indication of the input voltage, the progressive positions relative to the second side edge of the resistive material being substantially equally spaced relative to the second side edge to provide an exponential relationship in the voltage at the progressive positions with respect to the positions of such successive terminals.

30. In a combination as set forth in claim 29, the reference voltage being an electrical ground and the energizing voltage being a voltage with a particular magnitude.

31. In combination in an analog-to-digital converter, a substantially planar member having first and second opposite edges and having top and bottom edges and having a particular surface, an electrically resistive element disposed on the particular surface of the planar member, a plurality of terminals at equally spaced positions at the first opposite edge of the resistive element, and means for providing an energizing voltage to the resistive element to obtain voltages in a magnitude having an exponential relationship at successive terminals in the plurality with respect to the positions of such successive terminals at the first opposite edge of the resistive element.

32. In a combination as set forth in claim 31, the resistive element constituting a thin substantially uniform layer of an electrical resistance material on the member.

33. In a combination as set forth in claim 32, a plurality of comparators having first and second input terminals, means for applying an input signal to the first input terminal of each of the comparators, means for applying the voltage from each terminal on the resistive material to the second input terminal of an individual one of the comparators, and means for determining the input voltage from the outputs of the comparators.

34. In a combination as set forth in claim 33, the energizing voltage means providing the energizing voltage on the resistive element at particular positions relative to the terminals at the first opposite edge of the resistive element.

35. In a combination as set forth in claim 34, means for applying a ground voltage to the second opposite edge of the resistive element, and the energizing voltage being provided at particular positions near the corner of the resistive element adjacent the first opposite edge of the resistive element.

36. In a combination as set forth in claim 31, means for applying a reference voltage to the second opposite edge of the resistive element.

37. In a combination in an analog-to-digital converter, a member having an electrically resistive surface and having first and second opposite side edges and top and bottom edges, a first plurality of terminals disposed at particular positions relative to the first side edge of the electrically resistive surface in equally spaced relationship to one another, means for providing a voltage to the resistive surface to obtain, on the terminals in the first plurality, voltages having an exponential relationship with respect to the disposition of the successive terminals in the first plurality, a second plurality of terminals disposed at particular positions relative to the first side edge of the electrically resistive surface in equally spaced relationship to one another and displaced from the first plurality of terminals for producing voltages having a linear relationship with respect to the positions of such terminals in the second plurality.

38. In a combination as set forth in claim 37, means for applying a reference voltage to the second side edge of the electrically resistive surface at positions opposite the terminals in the first plurality, and the second plurality of terminals being displaced from the first plurality of terminals and the reference voltage means.

39. In a combination as set forth in claim 38, means for applying the reference voltage to the particular one of the top and bottom edges of the electrically resistive surface close to the second plurality of terminals.

40. In a combination as set forth in claim 39,
the electrically resistive surface on the member being in the form of a thin film having substantially constant characteristics at different positions on such surface.

41. In a combination as set forth in claim 38,
means for providing an energizing voltage to the electrically resistive surface at particular positions near the juncture between the first side edge of the resistive surface and the other one of the top and bottom edges.

42. In a combination as set forth in claim 38,
the reference voltage means extending along the length of the second side edge of the electrically resistive surface, and
the second plurality of terminals being disposed at a particular one of the top and bottom edges of the electrically resistive surface.

43. In combination in an analog-to-digital converter,
a planar member defined by first and second side edges and top and bottom edges,
a thin film of an electrically resistive material disposed substantially uniformly on the member,
a plurality of terminals disposed on the member relative to the first side edge of the member in equally spaced relationship to one another and in electrical communication with the thin film of the electrically resistive material, and
means for applying a voltage difference to the thin film of the electrically resistive material in a relationship to produce on the successive terminals voltages having an exponential relationship with respect to the positions of such successive terminals.

44. In a combination as set forth in claim 43,
means associated with the successive terminals for calibrating the voltages produced on such terminals by the voltage difference applied to the thin film of the electrically conductive material.

45. In a combination as set forth in claim 43,
the voltage difference means applying the voltage difference between one of the side edges of the thin film and the juncture of the other side edge of the thin film with one of the top and bottom edges of the thin film.

46. In a combination as set forth in claim 45,
the second side edge of the thin film receiving a reference voltage, and
means for providing an energizing voltage to the thin film at positions near the juncture between the first side edge of the thin film and the top edge of the thin film.

47. In a combination as set forth in claim 43,
means for providing an input voltage, and
a plurality of comparators each connected to the input voltage means and to an individual one of the successive terminals to co-operate with the other comparators in providing an indication of the value of the input voltage.

48. In combination in an analog-to-digital converter,
a planar member defined by first and second side edges and top and bottom edges,
a thin film of an electrically resistive material disposed substantially uniformly on the member,
a first plurality of terminals disposed on the thin film relative to the first side edge of the member in equally spaced relationship to one another and in electrical communication with the thin film of the electrically resistive material,
means for providing a voltage between the first and second side edges of the thin film to obtain an exponential relationship of the voltages at successive ones of the terminals in the first plurality with respect to the positions of such terminals, and
a second plurality of terminals disposed on the thin film relative to the first plurality of terminals to obtain an linear relationship of the voltages at successive ones of the terminals in the second plurality with respect to the positions of such terminals.

49. In a combination as set forth in claim 48,
the first plurality of terminals on the thin film providing higher voltages than the second plurality of terminals on the thin film.

50. In a combination as set forth in claim 49,
the second side edge of the thin film being grounded in the portion of the thin film opposite the terminals in the first plurality and a particular one of the top and bottom edges of the thin film closest to the second plurality of terminals being grounded and the first and second pluralities of terminals being disposed at progressive positions on the first side edge of the thin film.

51. In a combination as set forth in claim 50,
means for providing an energizing voltage to the thin film at particular positions near the juncture between the first side edge of the thin film and the particular one of the top and bottom edges of the thin film closest to the first successive terminals.

52. In a combination as set forth in claim 51,
the second side edge of the thin film being grounded along the second side edge and the second plurality of terminals being disposed at progressive positions along the other one of the top and bottom edges.

53. In a combination as set forth in claim 49,
means for providing an input voltage, and
a plurality of comparators each responsive to the input voltage and to the voltage at an individual one of the terminals in the first and second pluralities for cooperating with the other comparators in providing an indication of the magnitude of the input voltage.

54. In combination for calibrating an analog-to-digital converter,
a member having a thin resistive film and having a plurality of terminals equally spaced from one another relative to one edge of the film,
means for applying voltages to the thin film to obtain an exponential progression of voltages at successive terminals in the plurality with respect to the positions of such successive terminals, and
means for calibrating the voltages produced at the successive terminals to determine any deviations in such voltages from the exponential progression.

55. In a combination as set forth in claim 54,
the calibrating means including
a capacitance,
means for charging the capacitance,
means for providing a discharge of the capacitance, and
a plurality of comparators each responsive to the voltage on an individual one of the terminals and the voltage from the capacitance to provide a determination of any deviations from the exponential progression of the voltages at the successive terminals with respect to the positions of such successive terminals.

56. In a combination as set forth in claim 55, switching means having first and second states of operation, the capacitance-charging means being operative to charge the capacitance in the first state of operation of the switching means, the capacitance-discharging means being operative to discharge the capacitance in the second state of operation of the switching means.

57. In a combination as set forth in claim 56, the terminals being equally spaced relative to one edge of the thin film, the opposite edge of the thin film receiving a reference voltage, and means for providing an energizing voltage at particular positions near a juncture on the thin film between the one edge of the thin film and a third edge extending between the first and second edges of the thin film.

58. In combination for calibrating an analog-to-digital converter, a member having first and second oppositely disposed side edges and having top and bottom edges, the member having a substantially uniformly thin resistive film on one surface of the thin film and having a first plurality of terminals equally spaced from one another along the first side edge of the film, means for applying voltages between the first and second side edges of the thin film along the thin film between the top and bottom edges of the thin film to obtain an exponential relationship of the voltages at successive ones of the terminals in the first plurality in such thin film with respect to the positions of such successive terminals, means for calibrating the voltages on the thin film at the successive ones of the terminals in the plurality to determine any deviations from the exponential relationship, a second plurality of terminals disposed on the thin film to obtain a linear relationship of the voltages at successive ones of such terminals with respect to the positions of such successive terminals, and means for calibrating the voltages on the second plurality of terminals on the thin film to determine any deviations from the linear relationship of the voltage on such terminals with respect to the positions of such terminals.

59. In a combination as set forth in claim 58, the calibrating means for the exponential relationship including a capacitance and means for providing a charge in the capacitance at first particular times and means for providing a discharge of the capacitance at second particular times different from the first particular times and means for comparing the voltage across the capacitance with the voltages on the successive terminals in the first plurality on the thin film at the second particular times to calibrate the voltages on such successive terminals on the thin film.

60. In a combination as set forth in claim 59, the calibrating means for the linear relationship including the calibrating means for the exponential relationship and further including a source of substantially constant current.

61. In a combination as set forth in claim 60, the second plurality of terminals being disposed relative to the first side edge of the thin film at positions displaced along the first side edge from the first plurality of terminals on the thin film.

62. In a combination as set forth in claim 60, the second plurality of terminals being disposed at progressive positions relative to a particular one of the top and bottom edges of the thin film.

* * * * *